(12) United States Patent
Mott et al.

(10) Patent No.: US 9,252,651 B2
(45) Date of Patent: Feb. 2, 2016

(54) HIGH VOLTAGE DRIVER USING MEDIUM VOLTAGE DEVICES

(75) Inventors: Brian Mott, Rochester, NY (US); Imre Knausz, Rochester, NY (US)

(73) Assignee: SYNAPTICS INCORPORATED, San Jose, CA (US)

( * ) Notice: Subject to any disclaimer, the term of this patent is extended or adjusted under 35 U.S.C. 154(b) by 833 days.

(21) Appl. No.: 13/528,324

(22) Filed: Jun. 20, 2012

(65) Prior Publication Data

US 2013/0002149 A1 Jan. 3, 2013

Related U.S. Application Data

(60) Provisional application No. 61/502,718, filed on Jun. 29, 2011.

(51) Int. Cl.
| | |
|---|---|
| *H02M 1/088* | (2006.01) |
| *H03K 17/10* | (2006.01) |
| *H03K 17/687* | (2006.01) |

(52) U.S. Cl.
CPC ............. *H02M 1/088* (2013.01); *H03K 17/102* (2013.01); *H03K 17/6872* (2013.01); *Y10T 307/549* (2015.04)

(58) Field of Classification Search
CPC . H02M 1/088; H03K 17/102; H03K 17/6872; Y10T 307/549
See application file for complete search history.

(56) References Cited

U.S. PATENT DOCUMENTS

| | | | |
|---|---|---|---|
| 3,651,517 A | 3/1972 | Kurek et al. | |
| 4,079,336 A | 3/1978 | Gross | |
| 4,906,904 A * | 3/1990 | Tognoni ........................ | 315/408 |
| 5,546,040 A | 8/1996 | McCall et al. | |
| 5,717,560 A | 2/1998 | Doyle et al. | |
| 6,137,339 A | 10/2000 | Kibar et al. | |
| 6,137,367 A | 10/2000 | Ezzedine et al. | |
| 6,690,098 B1 * | 2/2004 | Saldana ........................ | 307/125 |
| 6,760,381 B2 | 7/2004 | Lu | |
| 6,801,186 B2 * | 10/2004 | Han et al. ...................... | 345/103 |
| 6,888,396 B2 * | 5/2005 | Hajimiri et al. ............... | 327/427 |
| 7,046,057 B1 | 5/2006 | Culler | |
| 7,106,628 B2 | 9/2006 | Watanabe | |

(Continued)

FOREIGN PATENT DOCUMENTS

| | | |
|---|---|---|
| JP | 2007074191 A | 3/2007 |
| WO | WO-2006033638 A1 | 3/2006 |

OTHER PUBLICATIONS

PCT international search report and written opinion of PCT/US2012/043129 dated Dec. 26, 2012.

(Continued)

*Primary Examiner* — Thomas J Hiltunen
(74) *Attorney, Agent, or Firm* — Patterson + Sheridan, LLP (57) ABSTRACT

A voltage drive circuit is constructed by stacking NMOS and PMOS transistors to provide high voltage levels with an output voltage swing greater than the breakdown voltage of the individual transistors used to build the voltage drive circuit. The voltage drive circuit may include a series stack of capacitors connected between gates of the stacked PMOS and NMOS transistors. The capacitive loading causes the gate signals to change more synchronously. Errors in timing for these gate signals, which would otherwise result in damage from exceeding the breakdown voltage across a pair of terminals of one of the NMOS and PMOS transistors, are mollified.

19 Claims, 8 Drawing Sheets

(56) References Cited

U.S. PATENT DOCUMENTS

| | | | |
|---|---|---|---|
| 7,248,120 B2 | 7/2007 | Burgener et al. | |
| 7,429,873 B2 | 9/2008 | Peschke | |
| 7,889,003 B2 * | 2/2011 | Basten | 330/251 |
| 8,310,283 B2 * | 11/2012 | Chen et al. | 327/112 |
| 8,330,504 B2 * | 12/2012 | Olson | 327/108 |
| 8,476,940 B2 * | 7/2013 | Kumar | 327/108 |
| 8,610,470 B2 * | 12/2013 | Iriguchi | 327/112 |
| 8,884,662 B2 * | 11/2014 | Ancis et al. | 327/112 |
| 2007/0279091 A1 | 12/2007 | Goel et al. | |
| 2010/0300862 A1 | 12/2010 | Tamura et al. | |
| 2011/0018625 A1 * | 1/2011 | Hodel et al. | 327/581 |
| 2012/0049956 A1 | 3/2012 | Lam | |
| 2012/0081165 A1 | 4/2012 | Huang et al. | |
| 2014/0062570 A1 * | 3/2014 | Yu | 327/333 |
| 2014/0306674 A1 * | 10/2014 | Kondou et al. | 323/271 |

OTHER PUBLICATIONS

Japanese Office Action; Application No. 2014-518636, dated Nov. 17, 2015, consists of 9 pages.

US 7,937,062, 05/2011, Burgener et al. (withdrawn)

* cited by examiner

HIGH VOLTAGE DRIVER USING MEDIUM VOLTAGE DEVICES

CROSS-REFERENCE TO RELATED APPLICATIONS

This application claims benefit of U.S. provisional patent application Ser. No. 61/502,718, filed Jun. 29, 2011, which is herein incorporated by reference.

BACKGROUND OF THE INVENTION

1. Field of the Invention

This invention generally relates to voltage drive circuits, and more specifically, to a high voltage drive circuit assembled from medium voltage devices.

2. Description of Related Art

Some electronic systems utilize one or more integrated circuits made of Field Effect Transistors (FETs) for amplification and switching purposes. The electronic systems may be integrated with display screens for displaying information to a user of the system. However, conventional integrated circuit (IC) FETs have a limited capability to withstand voltage between any two nodes, including gate-source, gate-drain and drain-source node pairs. Such voltage limitations may limit the usefulness and cause a breakdown of the IC in cases where the IC is fabricated using a process which yields FETs having a relatively low breakdown voltage.

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

BRIEF SUMMARY OF THE INVENTION

Embodiments presented in this disclosure include a voltage drive circuit for providing an output voltage. The voltage drive circuit includes a first plurality of transistors connected in series between a first source node and an output node and a plurality of voltage sources configured to provide a voltage to at least one of the first plurality of transistors. The voltage drive circuit further includes a plurality of capacitors coupled across gates of the first plurality of transistors, each capacitor configured to store charges associated with changes at gates of the transistors. Each of the plurality of capacitors has a capacitance selected to synchronize voltage changes at the first plurality of transistors.

Additional embodiments include a display device having voltage drive circuitry configured to provide a first voltage and a processing system coupled to the voltage drive circuitry. The processing system is configured to transmit a first logic signal to the voltage drive circuitry corresponding to the first voltage. The voltage drive circuitry includes a first plurality of transistors connected in series between a first source node and an output node and a plurality of voltage sources configured to provide a voltage to at least one of the first plurality of transistors. Each voltage source is configured to switch and maintain a voltage at a gate of at least one of the first plurality of transistors. The voltage drive circuitry further includes a plurality of capacitors coupled across gates of the first plurality of transistors, each capacitor configured to store charges associated with changes at gates of the transistors. The capacitors have capacitances selected to synchronize voltage changes at the first plurality of transistors. The voltage drive circuitry further includes at least one weak driver connected to at least one of the plurality of capacitors and configured to hold the connected capacitor from discharging.

Additional embodiments include a method for providing a high power output. The method includes applying a first source signal to a first source node of a first plurality of transistors connected in series, and charging a first plurality of capacitors coupled between gates of adjacent transistors of the first plurality of transistors connected in series at a rate operable to synchronize a change in state of the first plurality of transistors.

BRIEF DESCRIPTION OF DRAWINGS

So that the manner in which the above recited features can be understood in detail, a more particular description, briefly summarized above, may be had by reference to embodiments, some of which are illustrated in the appended drawings. It is to be noted, however, that the appended drawings illustrate only embodiments of the invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

A voltage drive circuit may be constructed by stacking NMOS and PMOS transistors to provide high voltage levels with an output voltage swing greater than the breakdown voltage of the individual transistors used to build the voltage drive circuit. The voltage drive circuit may include a series stack of capacitors connected between gates of the stacked PMOS and NMOS transistors. The voltage drive circuit further includes weak drivers in level shifters to drive signals to the gates of the stacked PMOS and NMOS transistors. During switching of the stacked PMOS and NMOS transistors, the combination of the weak buffers and capacitive loading advantageously causes adjacent gates of transistors to catch up and sync the switching of the gate signals. Any small errors in timing for these gate signals (e.g., by the level shifters) may then result in only small errors, since the gate voltages are changing more synchronously.

Figure 1:
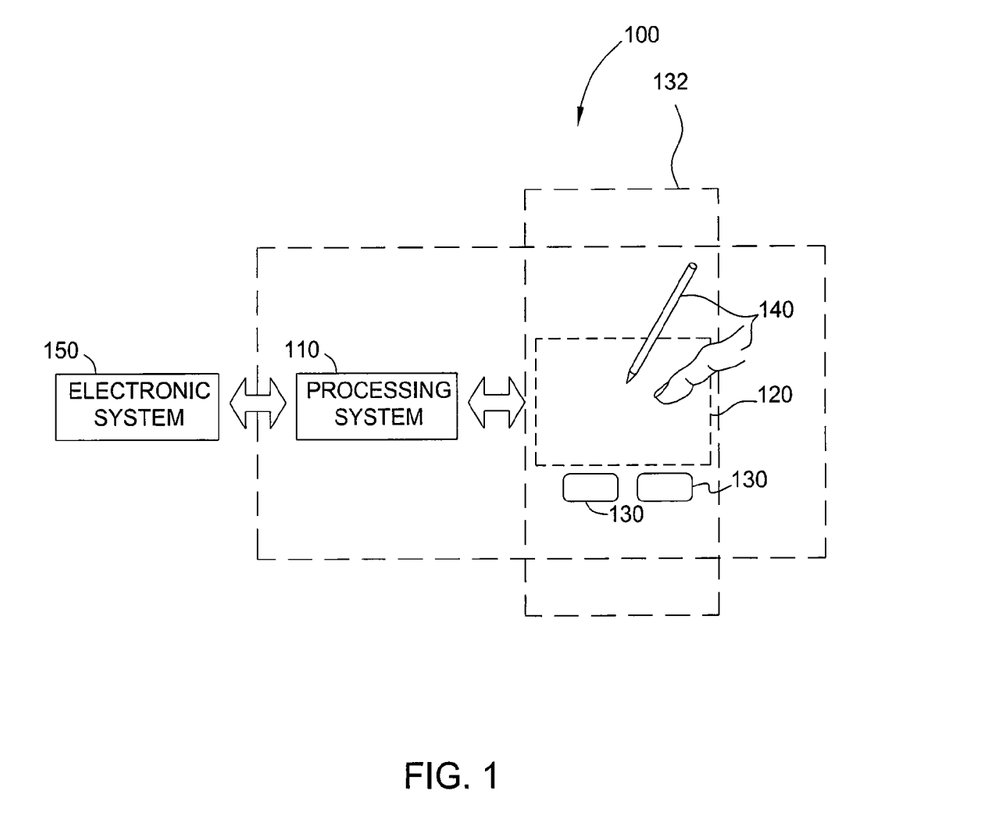
FIG. 1 is a schematic block diagram of an exemplary input device having an integrated display, according to an embodiment described herein.

FIG. 1 is a block diagram of an exemplary display device 132 integrated with an input device 100, in accordance with embodiments of the invention. The input device 100 may be configured to provide input to an electronic system 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system 150 could be a host or a slave to the input device.

The input device 100 can be implemented as a physical part of the electronic system 150, or can be physically separate from the electronic system 150. As appropriate, the input device 100 may communicate with parts of the electronic system 150 using any one or more of the following: buses, networks, and other wired or wireless interconnections. Examples include I$^2$C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system 150 (e.g., to a central processing system of the electronic system 150 that is separate from the processing system 110, if such a separate central processing system exists). In some embodiments, some part of the electronic system 150 processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system 150. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of the display screen 132. For example, the input device 100 may comprise substantially transparent sensor electrodes overlaying the display screen 132 and provide a touch screen interface for the associated electronic system 150. The display screen 132 may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen 132 may share physical elements. For example, some embodiments may utilize some of the same electrical components for displaying and sensing. As another example, the display screen 132 may be operated in part or in total by the processing system 110.

Figure 2:
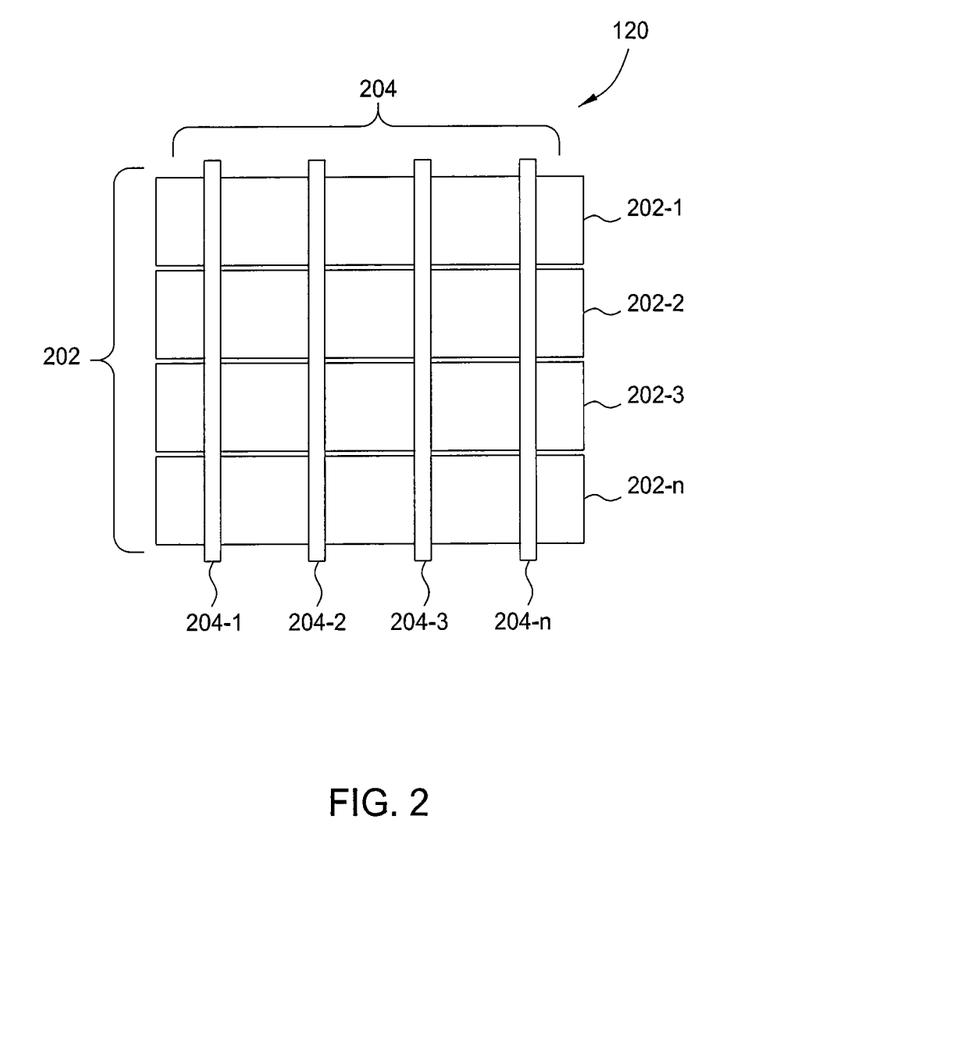
FIG. 2 illustrates an example sensor electrode pattern configured to sense in a sensing region associated with the pattern, according to some embodiments.

FIG. 2 shows a portion of an example sensor electrode pattern configured to sense in a sensing region associated with the pattern, according to some embodiments. For clarity of illustration and description, FIG. 2 shows a pattern of simple rectangles, and does not show various components. This sensor electrode pattern comprises a plurality of transmitter electrodes 202 (202-1, 202-2, 202-3, . . . 202-n), and a plurality of receiver electrodes 204 (204-1, 204-2, 204-3, . . . 204-n) disposed over the plurality of transmitter electrodes 202.

Transmitter electrodes 202 and receiver electrodes 204 are typically ohmically isolated from each other. That is, one or more insulators separate transmitter electrodes 202 and receiver electrodes 204 and prevent them from electrically shorting to each other. In some embodiments, transmitter electrodes 202 and receiver electrodes 204 are separated by insulative material disposed between them at cross-over areas; in such constructions, the transmitter electrodes 202 and/or receiver electrodes 204 may be formed with jumpers connecting different portions of the same electrode. In some embodiments, transmitter electrodes 202 and receiver electrodes 204 are separated by one or more layers of insulative material. In some other embodiments, transmitter electrodes 202 and receiver electrodes 204 are separated by one or more substrates; for example, they may be disposed on opposite sides of the same substrate, or on different substrates that are laminated together.

The areas of localized capacitive coupling between transmitter electrodes 202 and receiver electrodes 204 may be termed "capacitive pixels." The capacitive coupling between the transmitter electrodes 202 and receiver electrodes 204 change with the proximity and motion of input objects in the sensing region associated with the transmitter electrodes 202 and receiver electrodes 204.

In some embodiments, the sensor pattern is "scanned" to determine these capacitive couplings. That is, the transmitter electrodes 202 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and effectively produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 204 to be independently determined.

The receiver sensor electrodes 204 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In some touch screen embodiments, transmitter electrodes 202 comprise one or more common electrodes (e.g., "V-com electrode") used in updating the display of the display screen 132. These common electrodes may be disposed on an appropriate display screen substrate. For example, the common electrodes may be disposed on the TFT glass in some display screens (e.g., In Plan Switching (IPS) or Plan to Line Switching (PLS)), on the bottom of the color filter glass of some display screens (e.g., Patterned Vertical Alignment (PVA) or Multi-domain Vertical Alignment (MVA)), etc. In such embodiments, the common electrode can also be referred to as a "combination electrode", since it performs multiple functions. In various embodiments, each transmitter electrode 202 comprises one or more common electrodes. In other embodiments, at least two transmitter electrodes 202 may share at least one common electrode.

Conventional input devices and/or display devices may include one or more high voltage drive circuits configure to provide high voltage output drive levels. An example of such a voltage drive circuit 300 is shown in greater detail in FIGS. 3A and 3B. While the voltage drive circuit 300 is described in context of drivers for one or both of an input device 100 or a display device, it should be recognized that embodiments in accordance with the present technology may be used in a variety of applications where a relatively high voltage drive voltage is used. Some examples of application for the voltage drive circuit 300 include a high-voltage driver circuit to drive control signals to an LCD TFT panel, a piezoelectric transducer, and a proximity sensor device (sometimes called a "touch pad" or a "touch screen).

Figure 3A:
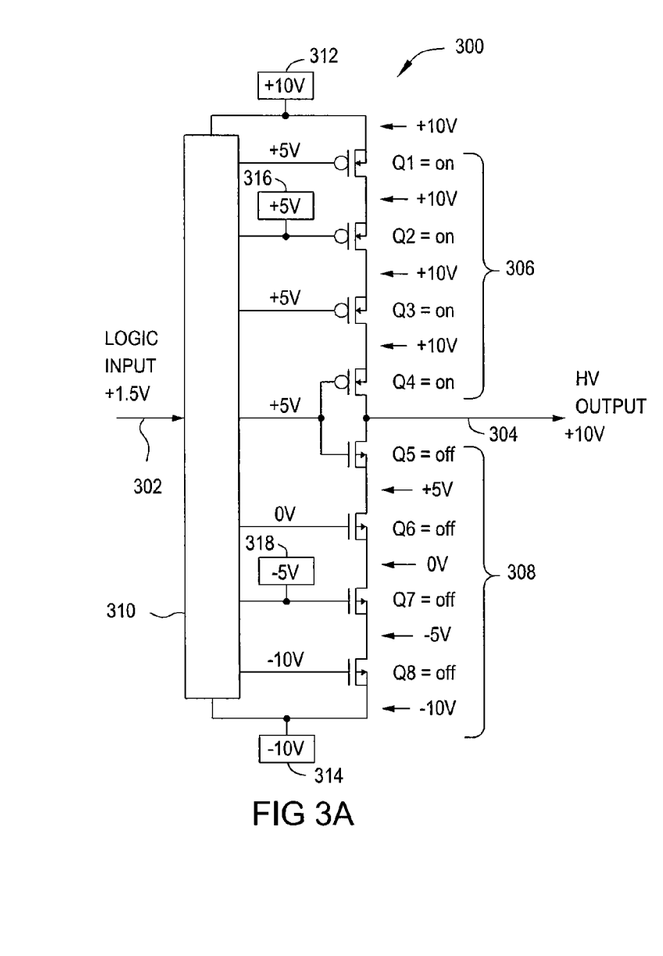
FIGS. 3A and 3B are schematic diagrams illustrating one example of a voltage drive circuit, according to an embodiment described herein.
Figure 3B:
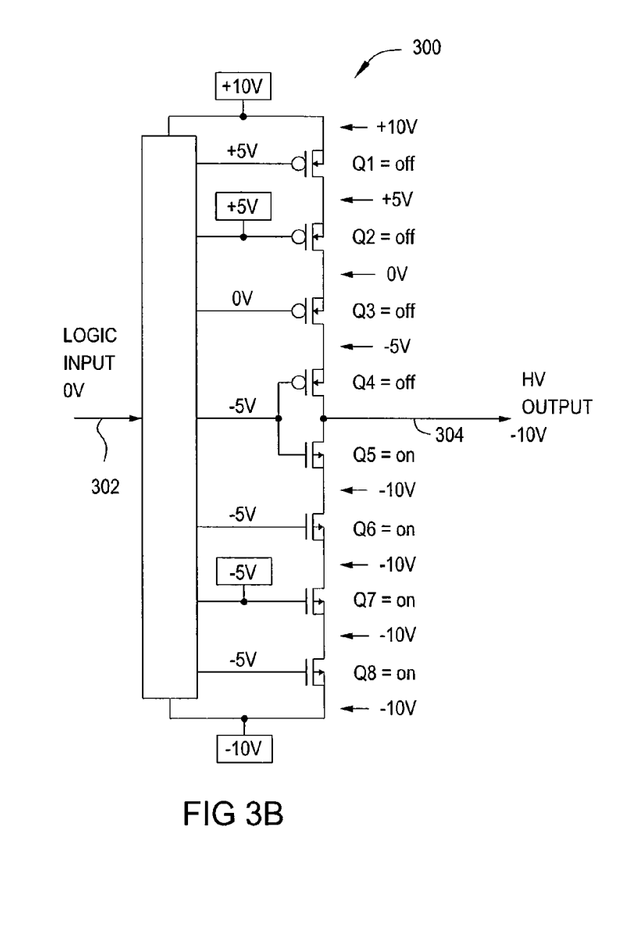

FIGS. 3A and 3B are schematic diagrams illustrating one example of a voltage drive circuit 300, according to an embodiment described herein. The voltage drive circuit 300 includes a plurality of transistors arranged to provide high voltage output drive levels at output node 304 in response to logical input provided at input node 302. The voltage drive circuit 300 further includes a plurality of cascaded level shifters 310 connected to the input node 302 and to gates of the transistors. The cascaded level shifters 310 translate logic signals from the input node 302 into gate control signals provided to the gates of the transistors.

Each of the transistors is fabricated and configured with a pre-determined rating, sometimes referred to as a "breakdown voltage," that specifies a maximum voltage that may be applied across any pair of the terminals of the transistor (e.g., source-drain, source-gate, gate-drain). If the voltage across any of pair of terminals exceeds the breakdown voltage, electrical breakdown may occur and the transistor may fail or become degraded. For sake of discussion, it may be assumed that each transistor in voltage drive circuit 300 has a pre-determined maximum breakdown voltage of +/−6V between any two terminals of the transistor. The transistors may be built in a properly biased deep N-well (DNW) such that the transistors are isolated from each other. Further, for sake of simplicity, it may also be assumed that all transistors have a threshold voltage of 0V.

To provide high voltage levels that may exceed the breakdown voltage of the individual transistors, the transistors of the voltage drive circuit 300 are arranged in a first stack of transistors 306 connected in series and a second stack of transistors 308 connected in series. For clarify of discussion, transistors connected in series generally refers to transistors that are connected such that a drain of one of the transistors is connected with a source of a next done of the transistors. The stacked series of transistors enable the breaking up of drain-to-source voltages to prevent device overstress from exceeding the breakdown voltage rated for the individual transistors. By way of example, the voltage drive circuit 300 may provide an output swing between approximately −8V and +10V, while the breakdown voltage of the individual transistors may be only 6.6V.

In one embodiment, the first stack of transistors 306 includes a plurality of PMOS transistors (labeled as Q1, Q2, Q3, and Q4) connected in series. A first voltage source 312 is connected to a source of a first one of the PMOS transistors (e.g., Q1). The drain of the last one of the PMOS transistors (e.g., Q4) is connected to the output node 304. The second stack of transistors 308 is configured as a complementary stack and may include a plurality of NMOS transistors (labeled as Q5, Q6, Q7, and Q8) connected in series. A second voltage source 314 is connected to a source of a first one of the NMOS transistors (e.g., Q8), and the drain of a last one of the NMOS transistors (e.g., Q5) is connected to the output node 304.

In one embodiment, the transistor Q2 is connected to the first transistor Q1 of the first stack of transistors 306 and to a voltage source 316 (e.g., +5V). The transistor Q2 acts as a PMOS "shield" transistor to keep the drain of the transistor Q1 at or above a particular voltage (e.g., +5V). Similarly, the transistor Q3, which is connected to the first transistor Q8 of the second track of transistors 308 and to a voltage source 318 (e.g., −5V), acts as a NMOS "shield" transistor to keep the drain of transistor Q8 at or below a particular voltage (e.g., +5V).

In the example shown in FIGS. 3A and 3B, the voltage drive circuit 300 is configured to deliver +10V and −10V voltage outputs responsive to logic inputs +1.5V and 0V, respectively. The first stack of transistors 306 is connected at the source of the first transistor Q1 to a voltage source 312 providing +10V, and the second stack of transistors 308 is connected at the source of the first transistor Q8 to a voltage source 314 providing −10V.

In operation, the voltage drive circuit 300 may operate in a first steady state to provide a first voltage output responsive to a first logic signal (as illustrated in FIG. 3A) and a second steady state to provide a second voltage output responsive to a second logic signal (as illustrated in FIG. 3B).

In the first steady state shown in FIG. 3A, responsive to the logic input of +1.5V at the input node 302, the cascaded level shifters 310 provide various gate drive signals or waveforms at the gates of the transistors Q1-Q8. In the example shown, a bias of +5V is applied to the gate of transistors Q1, Q2 (via the voltage source 316), Q3, Q4, and Q5; a bias of 0V, to the gate of transistor Q6; a bias of −5V to the gate of transistor Q7 (via the voltage source 318); and a bias of −10V to the gate of transistor Q8.

Accordingly, the transistor Q1 has a source voltage of +10V and a gate voltage of +5V, and is fully turned on. Similarly, the transistor Q2 has a source voltage of +10V and gate voltage +5V, and is therefore turned on, as are the transistors Q3 and Q4 for similar reasons. The transistors Q5 to Q8 are in a sub-threshold state and are turned off. As a result, the output node 304 cannot be pulled down, and is instead pulled up through the transistors Q1 to Q4 to +10V.

In the second steady state condition shown in FIG. 3B, responsive to the logic input of 0V at the input node 302, the cascaded level shifters 310 provide a different set of control signals to the gates of the transistors Q1-Q8. In the example shown, a bias of +10V is applied to the gate of transistor Q1; +5V, to the gate of transistor Q2 (via voltage source 316); a bias of 0V, to the gate of transistor Q3; a bias of −5V, to the gates of transistors Q4, Q5, Q6, Q7 (via the voltage source 318), and Q8.

Accordingly, the transistor Q8 has a source voltage of −10V and a gate voltage −5V, and is fully turned on. The transistor Q7 has a source voltage of −10V and gate voltage −5V, and is similarly turned on, as are the transistors Q6 and Q5. The transistors Q1 to Q4 are in a sub-threshold state and are turned off. Thus, the output node 304 cannot be pulled up, and is instead pulled down through the transistors Q5 to Q8 to a −10V.

Figure 4:
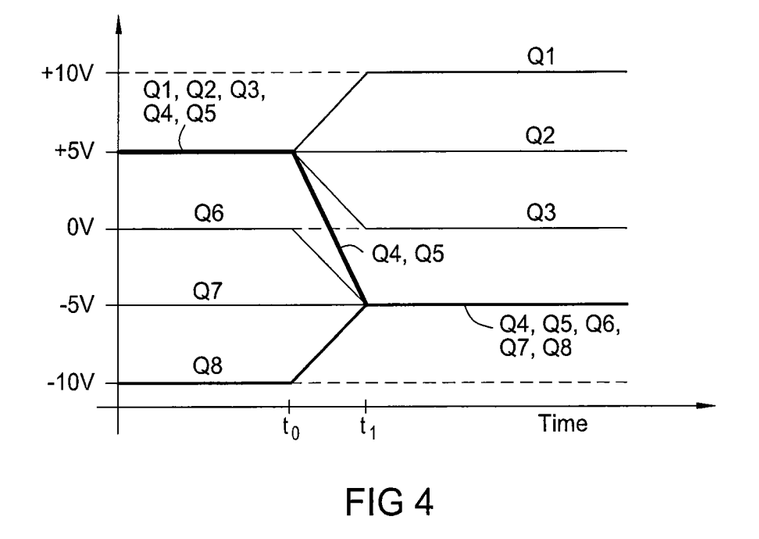
FIG. 4 is a chart depicting one scenario of changes in voltage over time across transistors of the voltage drive circuit of FIGS. 3A and 3B.

FIG. 4 is a chart depicting voltage changes seen at the gates of the transistors of the voltage drive circuit 300, as the voltage drive circuit transitions from the first steady state to the second steady state (and the output changes from high to low) if the voltage drive circuit 300 is performing ideally without lag as further described below. As shown, in the first steady state, when the voltage drive circuit 300 provides a high voltage output (e.g., +10V), the gate voltages at transistors Q1 to Q5 are at +5V; the gate voltage of transistor Q6 is at 0V; the gate voltage of transistor Q7 is at −5V; and the gate voltage of transistor Q8 is at −10V.

At time $t_0$, the transition to the second steady state begins, and the gate voltages at transistors Q1 to Q8 begin to change. At time $t_1$, the transition to the second steady state has been completed, and the voltage drive circuit 300 is now providing a low voltage output (e.g., −10V). As such, the gate voltage at transistor Q1 is now at +10V; the gate voltage of Q2 is at +5V; the gate voltage of transistor Q3 is at 0V; and the gate voltages of transistors Q4 to Q8 is at −5V.

However, in most real-world applications, one or more of the gate waveforms arrive at the gates of the transistors at different times, rather than in unison at the same time $t_0$. In this common scenario, the logic block is unable to synchronize the control signals, due to a variety of factors (e.g., device fabrication variation, voltage variations, and temperature variations, etc.), which undesirably results in the voltages between the gates exceeding their breakdown voltage.

Figure 5:
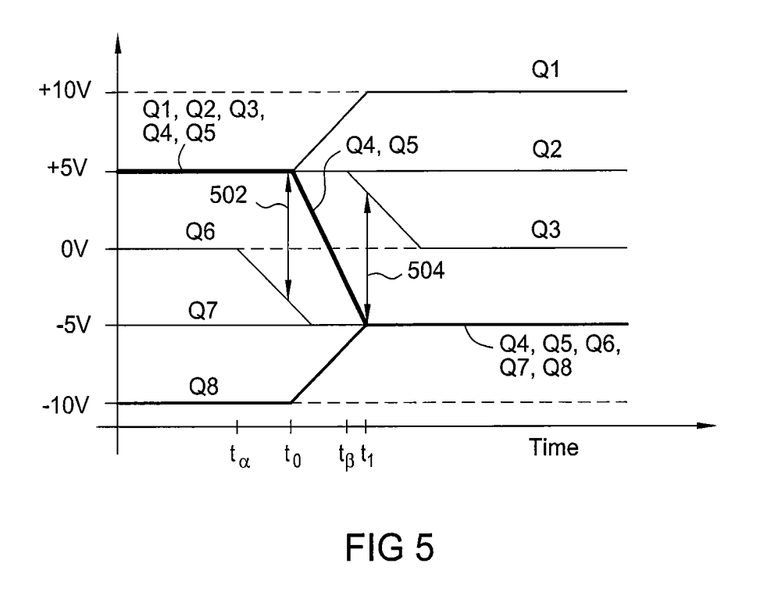
FIG. 5 is another chart depicting another scenario of changes in voltage over time across transistors of the voltage drive circuit of FIGS. 3A and 3B.

FIG. 5 depicts such a scenario in which one or more of the gate drive waveforms arrives early and/or late relative to the other gate drive waveforms. As in FIG. 4, initially, in the first steady state, the gate voltages at transistors Q1 to Q5 are at +5V; the gate voltage of transistor Q6 is at 0V; the gate voltage of transistor Q7 is at −5V; and the gate voltage of transistor Q8 is at −10V.

In the example of FIG. 5, a waveform reaches the gate of the transistor Q6 at $t_\alpha$, ahead of the waveform reaching the gate of the transistor Q5, which occurs at $t_0$. This asynchronous timing causes the drain voltage of the transistor Q6 (and the connected source of transistor Q5) to momentarily drop more than 5V below the Q5 gate voltage, as denoted by the arrow 502. Thus, the gate-to-source voltage of transistor Q5 will have momentarily exceeded the breakdown voltage of the transistor, which may cause breakdown and damage to Q5. In another example, a delayed waveform reaches the gate of the transistor Q3 at time $t_\beta$ after time $t_0$ when waveforms reach the gate of the transistor Q4. As such, due to the timing delay (e.g., $t_\beta$-$t_0$) the gate voltage of transistors Q4 drops at time $t_0$ before the gate voltage of Q3 at time $t_\beta$, causing the gate-to-source voltage Q4 to exceed the breakdown voltage, as denoted by arrow 504.

Accordingly embodiments of the present disclosure provide a mechanism that synchronizes transitions in gate voltages of the stacked transistors and provides high voltage outputs, while preventing damage to the voltage drive circuit by preventing the breakdown voltage of the individual transistors from being exceeded, such that the circuit functions as depicts in FIG. 8 below, and prevents damage caused by asynchronous operation as depicted in the chart of FIG. 5. The mechanism is shown in greater detail in FIGS. 6A and 6B.

Figure 6A:
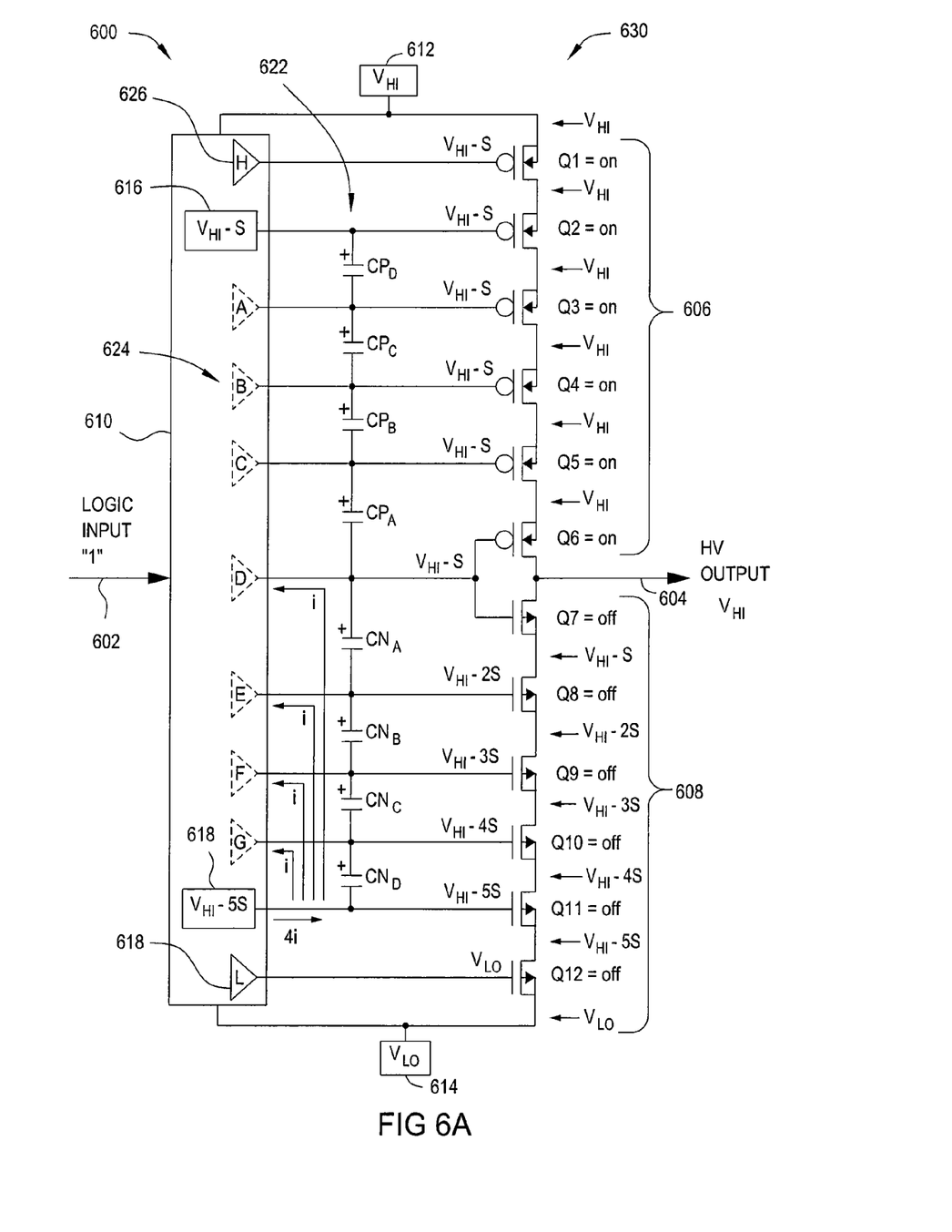
FIGS. 6A and 6B are schematic diagrams illustrating a voltage drive circuit having capacitors configured to synchronize voltage changes, according to an embodiment described herein.
Figure 6B:
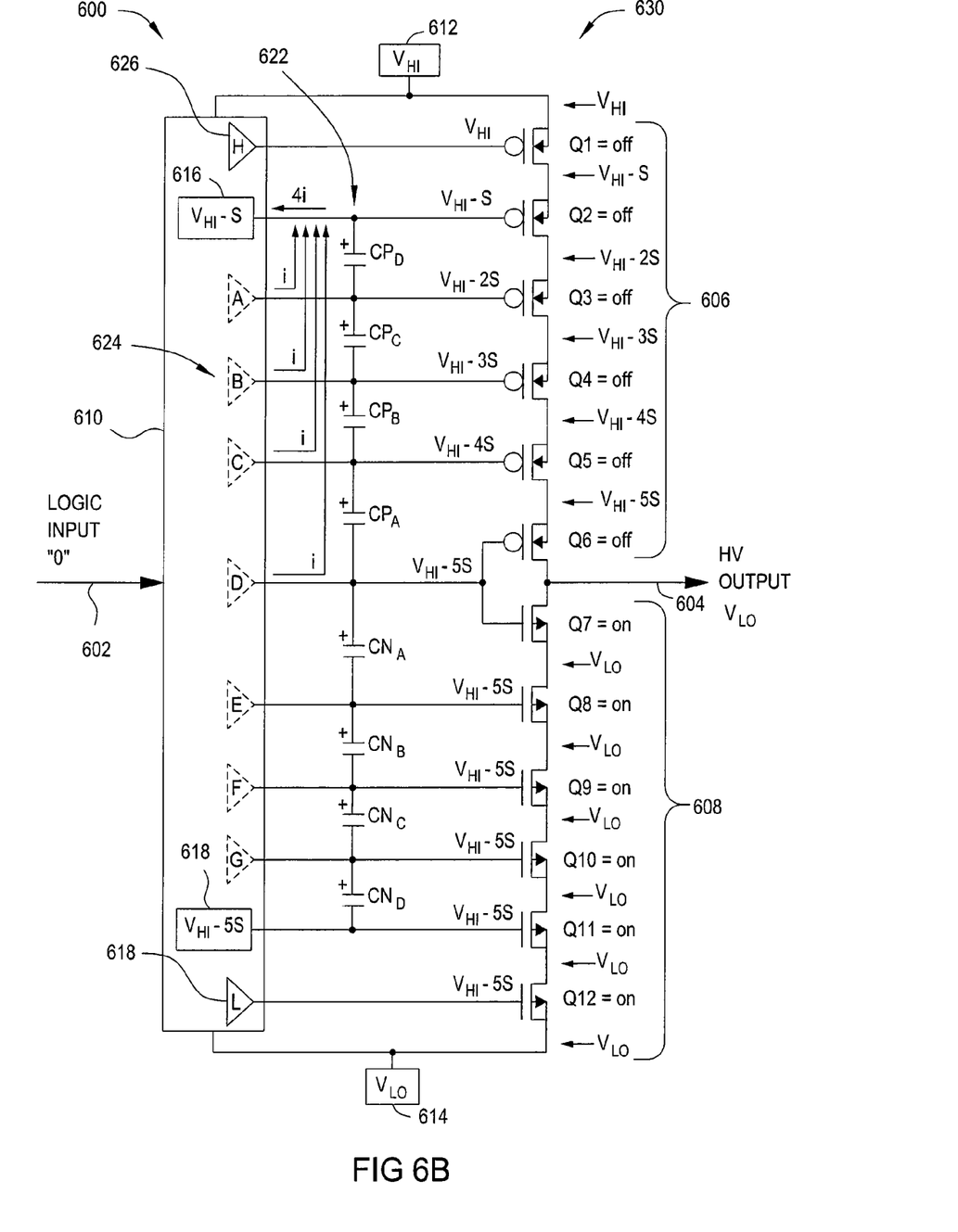

FIGS. 6A and 6B are schematic diagram illustrating one embodiment a voltage drive circuit 600 having capacitors configured to synchronize voltage changes. The voltage drive circuit 600 includes a plurality of transistors 630 arranged to provide high voltage output drive levels at an output node 604 in response to logical input provided at input node 602.

The voltage drive circuit 600 further includes a plurality of cascaded level shifters 610 connected to the input node 602 and to gates of the transistors 630. The cascaded level shifters 610 translate logic signals from the input node 602 into gate control signals provided to the gates of the transistors 630. The cascaded level shifters 610 include a plurality of weak drivers 624 (identified as drivers A, B, C, D, E, F, and G) and drivers 626 (identified as drivers H and L) configured to drive signals to the gates of the transistors 630. The cascaded level shifter 610 further includes DC voltage sources 616, 618.

In one embodiment, to provide high voltage levels with an output voltage swing greater than the breakdown voltage ($V_{BKDN}$) of the transistors used to build the voltage drive circuit 600, the voltage drive circuit 600 may be constructed by stacking NMOS and PMOS transistors as shown in FIG. 6. As shown, the transistors 630 of the voltage drive circuit 600 are arranged in a first stack of transistors 606 connected in series and a second stack of transistors 608 connected in series. In one embodiment, the first stack of transistors 606 includes a plurality of PMOS transistors (illustratively shown as Q1, Q2, Q3, Q4, Q5, and Q6) connected in series. A first voltage source 612 having a generalized value of $H_{HI}$ is connected to a source of a first one of the PMOS transistors (e.g., Q1). The drain of the last one of the PMOS transistors (e.g., Q6) is connected to the output node 604. The second stack of transistors 608 is configured as a complementary stack and includes a plurality of NMOS transistors (illustratively shown as Q7, Q8, Q9, Q10, Q11, and Q12) connected in series. A second voltage source 614 having a generalized value of $V_{LO}$ is connected to a source of a first one of the NMOS transistors (e.g., Q12), and the drain of a last one of the NMOS transistors (e.g., Q7) is connected to the output node 604.

It should be recognized that the voltage drive circuit 600 depicts only a specific implementation having transistor stacks 606, 608 comprised of transistors Q1 to Q12. It should be further recognized that aspects of the present disclosure may be extended to voltage drive circuits having greater or fewer amounts of stacked NMOS and PMOS transistors. The amount of stacked NMOS and PMOS transistors may be selected based on the desired voltage output levels and resultant voltage output swings. One technique for determining the number of NMOS and PMOS transistors is as follows. Generally, the output voltage swing of the voltage circuit 600 may be defined as ($V_{HI}$–$V_{LO}$), where $V_{HI}$>$V_{LO}$. The magnitude of the voltage across any pair of terminals ($V_{GS}$, $V_{GD}$, and $V_{DS}$) of the transistors 630 should not exceed $V_{BKDN}$. The magnitude of this voltage, S, is defined by Equation 1, below.

$$S = \frac{(V_{HI} - V_{LO})}{(\# NMOS)} = \frac{(V_{HI} - V_{LO})}{(\# PMOS)} \quad (1)$$

As such, the number of NMOS transistors and the number of PMOS transistors are each defined in Equation 2, below.

$$(\# \; NMOS) = (\# \; PMOS) = \text{CEILING}\left\{\frac{(V_{HI} - V_{LO})}{V_{BKDN}}\right\} \quad (2)$$

In one embodiment, the voltage drive circuit 600 includes a series stack of capacitors 622 connected between gates of adjacent transistors from transistors 630. The capacitors 622 are selected to synchronize the transitions in gate voltages of transistors 630 as the transistors shift from high to low voltage output. As shown, the string of capacitors (labeled as $CP_D$, $CP_C$, $CP_B$, $CP_A$, $CN_A$, $CN_B$, $CN_C$, and $CN_D$) are connected between the pairs of transistors Q2-Q3, Q3-Q4, Q4-Q5, Q5-Q6, Q7-Q8, Q8-Q9, Q9-Q10, and Q10-Q11, respectively. In one embodiment, the capacitance of the capacitors 622 may be selected to be large enough to prevent the effect of any small timing errors by level shifters 610, but not so large that the capacitors adversely affect the switching time of the output node 604 (e.g., between providing $V_{HI}$ and $V_{LO}$). The operations of the voltage drive circuit 600 having the plurality of capacitors 622 is described in further detail in conjunction with FIG. 7.

Figure 7:
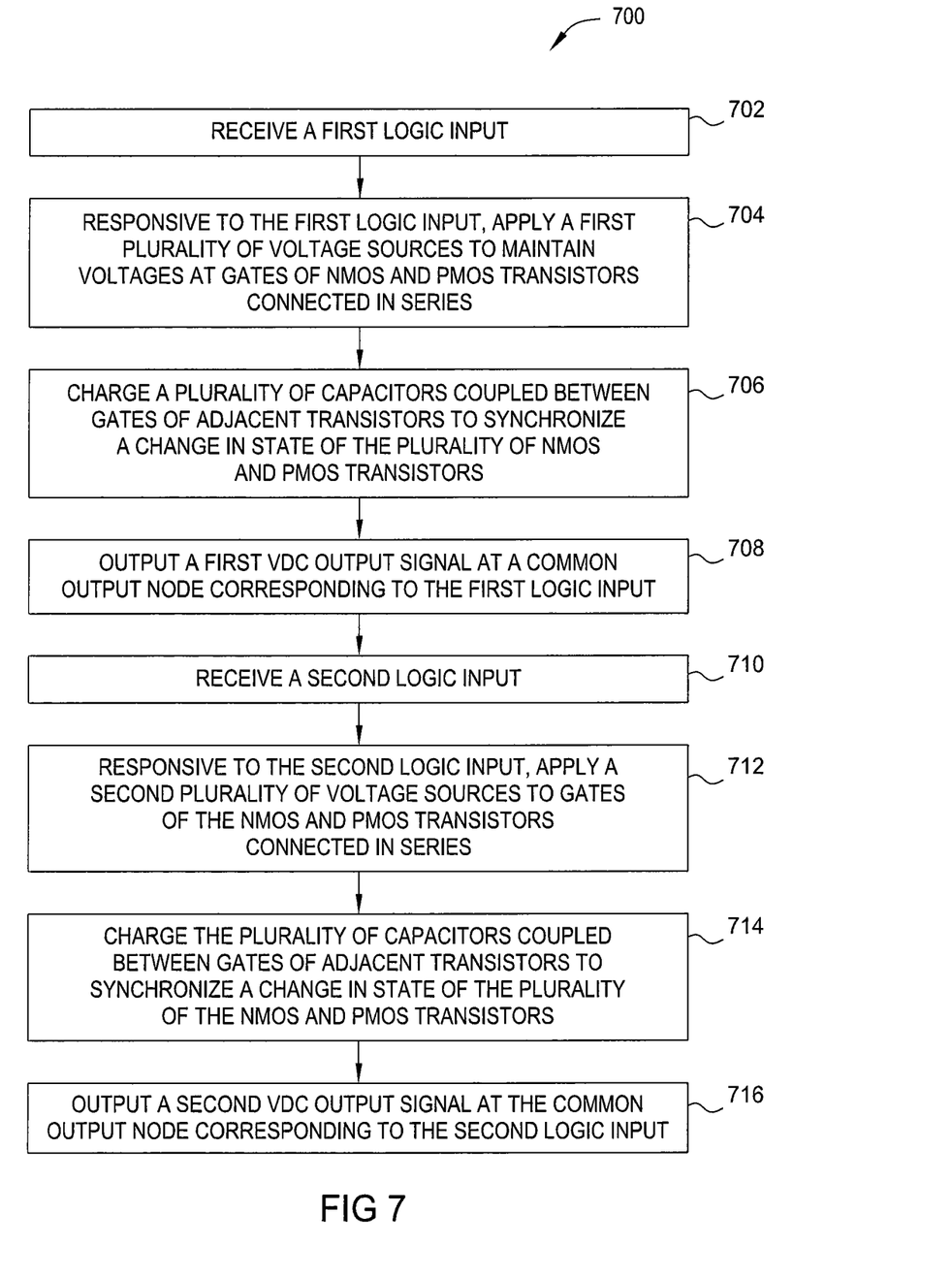
FIG. 7 is a flow diagram illustrating a method for providing a high power output, according to one embodiment of the invention.

FIG. 7 is a flow diagram illustrating a method for providing a high power output, according to one embodiment of the invention. It should be recognized that, even though the method is described in conjunction with the system of FIGS. 6A and 6B, any system configured to perform the method steps is within the scope of embodiments of the invention.

At 702, the voltage drive circuit 600 receives a first logic input, at 702. In some embodiments, the first logic input may correspond to a desired voltage output from the voltage drive circuit 600. For example, a logic input of "1" may be received to indicate a desired high voltage output.

At 704, responsive to the first logic input, the voltage drive circuit 600 applies a first plurality of voltage sources to maintain voltages at gates of NMOS and PMOS transistors 606, 608. The drivers 626 (e.g., drivers H and L) may be strong drivers in order switch the first transistors (e.g., Q1 and Q12) in each stack of transistors more rapidly. In some embodiments, the weak drivers 624 of the cascaded level shifters 610 may provide a plurality of voltage sources to the gates of the NMOS and PMOS transistors. The weak drivers 624 are configured to actively switch the gate voltages of the transistors 630, as well as maintain the gate voltages during steady state, even when there may be small leakage currents from the capacitors 622. Each of the weak drivers 624 may be matched such that the weak drivers 624 provide the same source and sink currents. In some embodiments, the magnitude of the source and sink currents (labeled as i in FIG. 6A) and the values of the capacitors 630 are chosen such that a small timing error $T_{ERR}$ between any of the weak drivers 624 does not cause an excessive instantaneous voltage error ($V_{ERR}$) during switching, as shown in Equation 3:

$$V_{ERR} \geq \frac{(iT_{ERR})}{C} \quad (3)$$

As shown in FIG. 6A, responsive to a logic input of "1," the driver H, voltage source 616 (e.g., $V_{HI}$-S), and weak drivers A, B, C, D begin to provide a gate voltage of $V_{HI}$-S to transistors Q1 to Q6, respectively. The weak drivers D, E, F, G, voltage source 618 (e.g., $V_{HI}$-5S), and driver L begin to provide gate voltages of $V_{HI}$-S, $V_{HI}$-2S, $V_{HI}$-3S, $V_{HI}$-4S, $V_{HI}$-5S, $V_{LO}$ to transistors Q7 to Q12, respectively.

It should be recognized that, in some cases, such as those illustrated in FIG. 5, the drivers may begin to provide gate voltages to the transistors Q1 to Q12 at various times. Accordingly, at 704, the voltage drive circuit 600 charges the plurality of capacitors 622 connected between gates of adjacent transistors to synchronize a change in state of the plurality of NMOS and PMOS transistors 606, 608. As shown in FIG. 6A, the capacitors $C_{PA}$, $C_{PB}$, $C_{PC}$, $C_{PD}$, $C_{NA}$, $C_{NB}$, $C_{NC}$, and $C_{ND}$ are charged to synchronize the change in state of transistors Q1 to Q12 while the plurality of voltage sources (e.g., provided by weak drivers 624) are applied to the gates of the transistors.

For example, in operation, the voltage source 618 (e.g., $V_{HI}$-5S) sources a current 4i into the bottom plate of capacitor $CN_D$. A portion of the current (e.g., i) sourced from the voltage source 618 travels through the capacitor $CN_D$ and into the driver G. Similarly, a portion of the current (e.g., i) sourced from the voltage source 618 travels through capacitors $CN_D$ and $CN_C$ and into driver F. Similarly, a portion of the current (e.g., i) sourced from the voltage source 618 travels through capacitors $CN_D$, $CN_C$, and $CN_B$ and into driver E. Similarly, a portion of the current (e.g., i) sourced from the voltage source 618 travels through capacitors $CN_D$, $CN_C$, $CN_B$, and $CN_A$ and into driver D.

At 708, the voltage drive circuit 600 outputs a first VDC output signal corresponding to the first logic input (e.g., "1") at the common output node 604. In the example shown in FIG. 6A, transistors Q1 to Q6 have a gate voltage of $V_{HI}$-S, as provided by the driver H, voltage source 616 (e.g., $V_{HI}$-S), and weak drivers A, B, C, D, respectively, and are fully turned on. Meanwhile, the transistors Q7 to Q12 are in a sub-threshold state and are turned off. As a result, the output node 604 may not be pulled down, and is instead pulled up through the transistors Q1 to Q6 to a high power output labeled as $V_{HI}$. It should be recognized that none of the transistors Q1 to Q12 through operations in 702 to 706 had voltages out of the range of S across any pair of terminals, thereby staying below voltage constraint $V_{BKDN}$ and preventing damage to the transistors.

At 710, the voltage drive circuit 600 may receive a second logic input. In some embodiments, the second logic input may correspond to another desired voltage output from the voltage drive circuit 600. For example, a logic input of "0" may be received to indicate a desired low voltage output from the voltage drive circuit 600.

At 712, responsive to the second logic input, the voltage drive circuit 600 applies a second plurality of voltage sources to maintain voltages at gates of NMOS and PMOS transistors 606, 608. For example, as shown in FIG. 6B, responsive to a logic input of "0," the driver H, voltage source 616 (e.g., $V_{HI}$-S), and weak drivers A, B, C, D begin to provide gate voltages of $V_{HI}$, $V_{HI}$-S, $V_{HI}$-2S, $V_{HI}$-4S, and $V_{HI}$-5S to PMOS transistors Q1 to Q6, respectively. The weak drivers D, E, F, G, voltage source 618 (e.g., $V_{HI}$-5S), and driver L begin to provide gate voltages of $V_{HI}$-5S to NMOS transistors Q7 to Q12, respectively.

At 714, the voltage drive circuit 600 charges the plurality of capacitors 622 connected between gates of adjacent transistors to synchronize a change in state of the plurality of NMOS and PMOS transistors 606, 608. As shown in FIG. 6B, the capacitors $CP_A$, $CP_B$, $CP_C$, $CP_D$, $CN_A$, $CN_B$, $CN_C$, and $CN_D$ are charged to synchronize the change in gate voltages of transistors Q1 to Q12 from the first plurality of voltage sources (e.g., provided at 704) to the second plurality of voltage sources.

For example, in operation, driver D sources a current i into the bottom plate of capacitor $CP_A$. The current i travels through capacitors $CP_A$, $CP_B$, $CP_C$, and $CP_D$ into the DC voltage source 616 (e.g., $V_{HI}$-S). Similarly, driver C sources a current i into the bottom plate of capacitor $CP_B$, which travels through $CP_B$, $CP_C$, and $CP_D$ into the DC voltage source 616. Driver B sources the current i into the bottom plate of capacitor $CP_C$, which travels through $CP_C$ and $CP_D$ into the DC voltage source 616. Driver A sources the current i into the bottom plate of capacitor $CP_C$, which travels through $CP_D$ into the DC voltage source 616.

At 716, the voltage drive circuit 600 outputs a second VDC output signal corresponding to the second logic input (e.g., "0") at the common output node 604. In the example shown in FIG. 6B, transistors Q6 to Q12 now have a gate voltage of $V_{HI}$-5S, as provided by weak drivers D, E, F, G, voltage source 618 (e.g., $V_{HI}$-5S), and driver L, and are fully turned on. The transistors Q1 to Q6 are in a sub-threshold state and are turned off. Accordingly, the output node 604 cannot be pulled up, and is instead pulled down through the transistors Q6 to Q12 to $V_{LO}$. Again, it should be recognized that the transistors Q1 to Q12 of voltage drive circuit 600 provide an output signal having a voltage swing from $V_{HI}$ to $V_{LO}$ while having voltages in the range of S across any pair of terminals, and thereby staying below voltage constraint $V_{BKDN}$ and preventing damage to the transistors.

Table 1 below illustrates the steady state voltages at each plate of each of the capacitors 622 for each logic state (e.g., the first logic input), as well as the resulting voltage across each capacitor 622. As shown, when the logic input (e.g., provided at input node 602) changes from 0 to "1", the change in voltage across each of the capacitors $CP_A$, $CP_B$, $CP_C$, and $CP_D$ is (-S), while the voltage change across capacitors $CN_A$, $CN_B$, $CN_C$, and $CN_D$ is (+S). By symmetry, when the logic input changes from "0" to "1," these voltage changes occur in the opposite direction.

TABLE 1

Capacitor Voltages vs. Logic State

| | Logic Input = 0 | | | Logic Input = 1 | | | Resulting Voltage Change Across Cap. |
|---|---|---|---|---|---|---|---|
| Cap. | Top Plate | Bottom Plate | Voltage Across Cap. | Top Plate | Bottom Plate | Voltage Across Cap. | |
| $CP_D$ | $V_{HI}$-S | $V_{HI}$-2S | S | $V_{HI}$-S | $V_{HI}$-S | 0 | -S |
| $CP_C$ | $V_{HI}$-2S | $V_{HI}$-5S | S | $V_{HI}$-S | $V_{HI}$-S | 0 | -S |
| $CP_B$ | $V_{HI}$-3S | $V_{HI}$-4S | S | $V_{HI}$-S | $V_{HI}$-S | 0 | -S |
| $CP_A$ | $V_{HI}$-4S | $V_{HI}$-5S | S | $V_{HI}$-S | $V_{HI}$-S | 0 | -S |
| $CN_A$ | $V_{HI}$-5S | $V_{HI}$-5S | 0 | $V_{HI}$-S | $V_{HI}$-2S | S | +S |
| $CN_B$ | $V_{HI}$-5S | $V_{HI}$-5S | 0 | $V_{HI}$-2S | $V_{HI}$-3S | S | +S |
| $CN_C$ | $V_{HI}$-5S | $V_{HI}$-5S | 0 | $V_{HI}$-3S | $V_{HI}$-4S | S | +S |
| $CN_D$ | $V_{HI}$-5S | $V_{HI}$-5S | 0 | $V_{HI}$-4S | $V_{HI}$-5S | S | +S |

It has been determined that having the same rate of voltage change across each of the capacitors $CP_A$, $CP_B$, $CP_C$, and $CP_D$ and the opposite rate of voltage change across each of the capacitors $CN_A$, $CN_B$, $CN_C$, and $CN_D$ may be desirable. The rate of voltage change across a capacitor is equal to the instantaneous current through the capacitor divided by the capacitance as shown in Equation 4:

$$\frac{dV}{dt} = \frac{i(t)}{C} \quad (4)$$

Accordingly, in some embodiments, each of the capacitors 622 (e.g., $CP_D$) may be selected to have a capacitance greater than a capacitance of a next capacitor (e.g., $CP_C$) connected between a gate of the next one of the transistors and a gate of a subsequent next one of the transistors. For example, because more current flows through $CP_D$ than flows through $CP_C$ (as shown in FIG. 6B), $CP_D$ may be selected to have a capacitance greater than the capacitance of $CP_C$ (i.e., next capacitor), which is connected between a gate of the next one of the transistors (e.g., Q3) and a gate of a subsequent next one of the transistors (e.g., Q4). Similarly, $CN_D$ may be selected to have a capacitance greater than the capacitance of $CN_C$ (i.e., next capacitor), which is connected between a gate of the next one of the transistors (e.g., Q10) and a gate of a subsequent next one of the transistors (e.g., Q9).

In some embodiments, the slew rates of the gate voltages to some transistors (e.g., Q5 and Q8) may be half that of the gate voltages to adjacent transistors with each transistor stack (e.g., Q6 and Q7). Accordingly, in some embodiments, each of the capacitors 622 may be selected to have a capacitance that is a multiple of capacitance C, where capacitance C may be the capacitance of a capacitor connected between a gate of a penultimate one of the transistors and a gate of a last one of the transistors. For example, as shown in FIG. 6A, twice as much current flows through capacitor $CP_B$ as does flow through capacitor $CP_A$. As such, the capacitance of $CP_B$ may be selected to be twice (e.g., 2C) as large as the capacitance C of $CP_A$, where $CP_A$ is connected between a gate of a penultimate one of the transistors (e.g., Q5) and a gate of a last one of the transistors (e.g., Q6). In another example, the capacitance of $CP_C$ may be selected to be three times (e.g., 3C) as large as the capacitance C of $CP_A$, because three times as much current flows through capacitor $CP_C$ as does flow through capacitor $CP_A$.

Similarly, referring to the NMOS transistors Q6 to Q12 and connected capacitors, $CN_D$ may be selected to have a capacitance greater than the capacitance of $CN_C$ (i.e., next capacitor), which is connected between a gate of the next one of the transistors (e.g., Q10) and a gate of a subsequent next one of the transistors (e.g., Q9).

Figure 8:
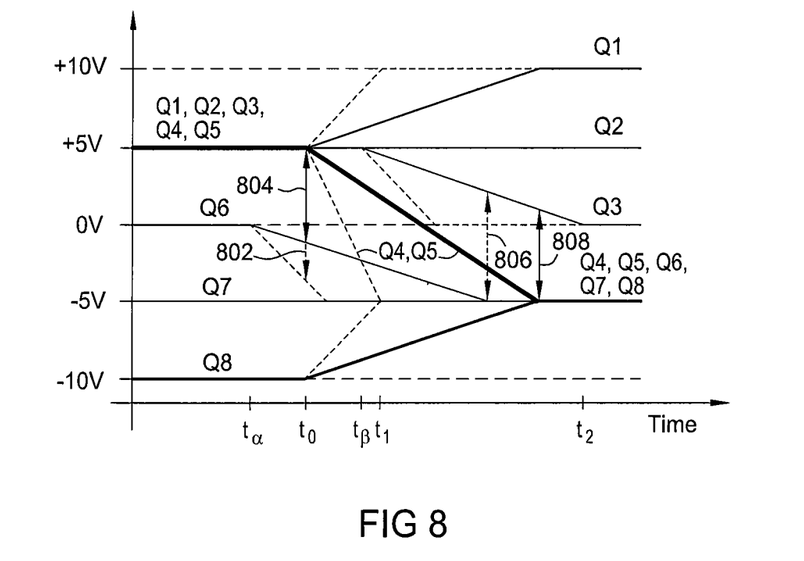
FIG. 8 is a chart depicting a scenario of changes in voltage over time across transistors of a voltage drive circuit, according to an embodiment described herein.

FIG. 8 is a chart depicting changes in gate voltages over time of the transistors of a voltage drive circuit similar to the voltage drive circuit 600 of FIGS. 6A and 6B having a plurality of capacitors 622 connected between gates of adjacent stacked transistors. As shown, initially, in the first steady state, gate voltages at transistors Q1 to Q5 are at +5V; the gate voltage of transistor Q6 is at 0V; the gate voltage of transistor Q7 is at -5V; and the gate voltage of transistor Q8 is at -10V. To facilitate comparison with FIG. 5, the voltage drive circuit discussed in conjunction with FIG. 8 uses a same amount of transistors (e.g., Q1 to Q6) as the voltage drive circuit 300. Additionally, for sake of comparison, the gate drive waveforms in a voltage drive circuit 300, which may not have capacitors connected between the gates of transistors, are illustrated in dotted lines.

In the scenario depicted in FIG. 8, as with FIG. 5, one or more of the gate drive waveforms arrives early and/or late relative to the other gate drive waveforms. Specifically, a waveform reaches the gate of the transistor Q6 at $t_\alpha$, ahead of the waveform reaching the gate of the transistor Q5, which occurs at $t_0$. However, the addition of capacitors connected between gates of adjacent stacked transistors (e.g., capacitors 622) causes the gate voltages to change with more synchronicity. As shown, the use of capacitors 622 reduces the gate-to-source voltage difference of transistor Q5 (illustrated by arrows 802 and 804). In another example, a delayed waveform reaches the gate of the transistor Q3 at time $t_\beta$ after time $t_0$ when waveforms reach the gate of the transistor Q4. The capacitors 622 connected between gates of adjacent transistors are charging during the timing delay (e.g., $t_\beta$-$t_0$), and reduce the gate-to-source voltage difference for transistor Q4, as illustrated by arrows 806 and 808. Thus, embodiments of the present disclosure reduce a maximum voltage difference between any two terminals of transistors during transitions from one steady state to another, thereby reducing damage and breakdown to the voltage drive circuit.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

We claim:

1. A voltage drive circuit, comprising:
a first plurality of transistors connected in series between a first source node and an output node;
a plurality of voltage sources configured to provide a voltage to at least one of the first plurality of transistors; and
a plurality of capacitors coupled across gates of the first plurality of transistors, each capacitor configured to store charges associated with changes at gates of the transistors, wherein the plurality of capacitors have capacitances selected to synchronize voltage changes at the first plurality of transistors,
wherein the voltage drive circuit is configured to transition from a first steady state that provides a first voltage to a second steady state that provides a second voltage;
wherein the plurality of capacitors are configured to store charges while transitioning from the first steady state to the second steady state; and
wherein a difference between the first and second voltages is greater than a breakdown voltage of each of the first plurality of transistors.

2. The voltage drive circuit of claim 1, wherein each of the plurality of voltage sources is configured to switch and maintain a voltage at a gate of at least one of the first plurality of transistors.

3. The voltage drive circuit of claim 1, further comprising:
a second plurality of transistors in series between a second source node and the output node.

4. The voltage drive circuit of claim 3, wherein the first plurality of transistors in series comprises a plurality of PMOS transistors; wherein the second plurality of transistors in series comprises a plurality of NMOS transistors; wherein transistors of the first and second plurality of transistors are arranged such that a drain of each of the transistors is connected with a source of a next one of the transistors; and
wherein a drain of a last one of the PMOS transistors and drain of a last one of the NMOS transistors is connected to the output node.

5. The voltage drive circuit of claim 1, wherein the first plurality of transistors connected in series are connected such that a drain of one of the transistors is connected with a source of a next one of the transistors; and wherein each one of the capacitors is connected between a gate of one of the transistors and a gate of the next one of the transistors.

6. The voltage drive circuit of claim 5, wherein each of the plurality of capacitors has a capacitance greater than a capacitance of a next capacitor connected between a gate of the next one of the transistors and a gate of a subsequent next one of the transistors.

7. The voltage drive circuit of claim 5, wherein each of the plurality of capacitors has a capacitance that is a multiple of capacitance C, capacitance C being a capacitance of a last one of the capacitors connected between a gate of a penultimate one of the transistors and a gate of a last one of the transistors.

8. A display device, comprising:
voltage drive circuitry configured to provide a first voltage, the voltage drive circuitry comprising:
a first plurality of transistors connected in series between a first source node and an output node;
a plurality of voltage sources configured to provide a voltage to at least one of the first plurality of transistors, wherein each voltage source is configured to switch and maintain a voltage at a gate of at least one of the first plurality of transistors;
a plurality of capacitors coupled across gates of the first plurality of transistors, each capacitor configured to store charges associated with changes at gates of the transistors, wherein the plurality of capacitors have capacitances selected to synchronize voltage changes at the first plurality of transistors; and
at least one weak level shifter connected to at least one of the plurality of capacitors and configured to hold the connected capacitor from discharging; and
a processing system coupled to the voltage drive circuitry and configured to transmit a first logic signal to the voltage drive circuitry corresponding to the first voltage.

9. The display device of claim 8, wherein the voltage drive circuit is configured to transition from a first steady state that provides the first voltage to a second steady state that provides a second voltage;
wherein the plurality of capacitors are configured to store charges while transitioning from the first steady state to the second steady state; and
wherein a difference between the first and second voltages is greater than an individual breakdown voltage of each of the first plurality of transistors.

10. The display device of claim 8, wherein the voltage drive circuit further comprises:
a second plurality of transistors in series between a second source node and the output node, the second plurality of transistors in series comprising a plurality of NMOS transistors;
wherein the first plurality of transistors in series comprises a plurality of PMOS transistors; wherein transistors of the first and second plurality of transistors are arranged such that a drain of each of the transistors is connected with a source of a next one of the transistors; and
wherein a drain of a last one of the PMOS transistors and drain of a last one of the NMOS transistors is connected to the output node.

11. The display device of claim 8, wherein the first plurality of transistors connected in series are connected such that a drain of one of the transistors is connected with a source of a next one of the transistors; and wherein at least one of the capacitors is connected between gates of each adjacent pair of the first plurality of transistors connected in series.

12. The display device of claim 11, wherein each of the plurality of capacitors has a capacitance that is a multiple of capacitance C, capacitance C being a capacitance of a last one of the capacitors connected between a gate of a penultimate one of the transistors and a gate of a last one of the transistors.

13. A method for providing a high power output, the method comprising:

applying a first source signal to a first source node of a first plurality of transistors connected in series; and charging a first plurality of capacitors coupled between gates of adjacent transistors of the first plurality of transistors connected in series at a rate operable to synchronize a change in state of the first plurality of transistors, wherein the change in state of the first plurality of transistors comprises a change from a first steady state providing a first voltage to a second steady state providing a second voltage, wherein the first plurality of capacitors are configured to store charges while transitioning from the first steady state to the second steady state; and wherein a difference between the first and second voltages is greater than a breakdown voltage of each of the first plurality of transistors.

14. The method of claim 13, further comprising:

applying a second source signal to a second source node of a second plurality of transistors connected in series to common output node with the first plurality of transistors; and charging a second plurality of capacitors coupled between gates of adjacent transistors of the second plurality of transistors connected in series at a rate operable to synchronize a change in state of the second plurality of transistors.

15. The method of claim 14, wherein the applying the first source signal and the applying the second source signal comprises:

applying a first voltage that exceeds a breakdown voltage of at least one of the first plurality of transistors to the first source node;

applying a second voltage that exceeds a breakdown voltage of at least one of the second plurality of transistors to the second source node; and outputting a first or second VDC output signal at the common output node in response to the first and second voltages.

16. The method of claim 13, wherein each of the plurality of transistors has a capacitance selected based on a number of the plurality of transistors and a difference between the first and second voltages.

17. The method of claim 13, wherein the applying the first source signal comprises applying a voltage of 10 VDC to the first source node; and wherein a voltage across a source and a drain of each of the first plurality of transistors in series does not exceed 6.6 VDC.

18. The method of claim 13, wherein the charging the plurality of capacitors comprises limiting a voltage across a drain and a source of each of the first plurality of transistors connected in series to less than 6.6 VDC.

19. The method of claim 13, wherein the applying the first source signal comprises applying a voltage that exceeds a breakdown voltage of at least one of the first plurality of transistors to the first source node.

* * * * *